United States Patent
Sanchez

(10) Patent No.: US 9,304,534 B1
(45) Date of Patent: Apr. 5, 2016

(54) LOW VOLTAGE SWING BUFFER

(71) Applicant: Hector Sanchez, Cedar Park, TX (US)

(72) Inventor: Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 4 days.

(21) Appl. No.: 14/494,976

(22) Filed: Sep. 24, 2014

(51) Int. Cl.
*G06F 1/00* (2006.01)
*G06F 1/10* (2006.01)

(52) U.S. Cl.
CPC ........................................ *G06F 1/10* (2013.01)

(58) Field of Classification Search
USPC ......... 327/291, 293, 294, 298, 309, 312–313, 327/333; 326/80–83
See application file for complete search history.

(56) References Cited

U.S. PATENT DOCUMENTS

| | | | |
|---|---|---|---|
| 5,150,186 A | 9/1992 | Pinney et al. | |
| 5,402,081 A | 3/1995 | Wong et al. | |
| 5,850,157 A * | 12/1998 | Zhu | G06F 1/04 327/165 |
| 6,426,658 B1 | 7/2002 | Mueller et al. | |
| 7,417,454 B1 | 8/2008 | Rahman et al. | |
| 7,567,096 B2 * | 7/2009 | Mohammad | H03K 19/0016 326/34 |
| 7,683,670 B2 | 3/2010 | Cheng et al. | |
| 8,143,917 B2 | 3/2012 | Jang et al. | |
| 2007/0164785 A1 | 7/2007 | He | |
| 2008/0237657 A1 | 10/2008 | Kapoor | |
| 2009/0146688 A1 | 6/2009 | Lane et al. | |
| 2011/0006810 A1 | 1/2011 | Nedalgi | |

OTHER PUBLICATIONS

Golshan, R. and Haroun, B., "A novel reduced swing CMOS BUS interface circuit for high speed low power VLSI systems," IEEE International Symposium on Circuits and Systems, vol. 4, May 30-Jun. 2, 1994, pp. 351-354.
Yang, B. and Kim, L., "High-Speed and Low-Swing On-Chip Bus Interface Using Threshold Voltage Swing Driver and Dual Sense Amplifier Receiver," Proceedings of the 26th European Solid-State Circuits Conference, 2000, pp. 105-108.
Zimmermann, R. and Fichtner, W., "Low-Power Logic Styles: CMOS Versus Pass-Transistor Logic," IEEE Journal of Solid-State Circuits, vol. 32, No. 7, Jul. 1997, pp. 1079-1090.

* cited by examiner

*Primary Examiner* — An Luu
(74) *Attorney, Agent, or Firm* — Abel Law Group, LLp

(57) ABSTRACT

An apparatus includes a first circuit of a first type that couples an output node to a first power supply node in response to a first value of a control signal. The apparatus includes a second circuit of a second type to couple the output node to the first power supply node in response to a first value of a first signal having a first voltage swing. The apparatus includes a third circuit of the second type to couple the output node to a second power supply node in response to a second value of the first signal. The apparatus includes a control circuit that generates the control signal based on the first signal and an output signal on the output node. The first, second, and third circuits generate an output signal on the output node. The output signal has a second voltage swing less than the first voltage swing.

20 Claims, 7 Drawing Sheets

US 9,304,534 B1

LOW VOLTAGE SWING BUFFER

BACKGROUND

1. Field of the Invention

This invention relates to integrated circuits and more particularly to circuits used in signal distribution of integrated circuits.

2. Description of the Related Art

In general, integrated circuits use a distribution network to deliver a signal to every element of an integrated circuit that needs that signal. Such signal distribution may consume a substantial amount of a total power budget for a system-on-a-chip (SoC) or other integrated circuit. For example, clock distribution consumes approximately 30% to 40% or more of the total power budget for a typical SoC. As integrated circuit technology advances, power supply voltage levels are not decreasing as fast as the increase in the need for computing power, and integrated circuit technology advances are not generating substantial power savings. For mobile applications, power consumption may influence the cost and complexity, as well as the speed and performance, of electrical components. Accordingly, techniques for reducing the power consumption of distributing signals on an integrated circuit are desired.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates similar or identical items.

DETAILED DESCRIPTION

Figure 1:
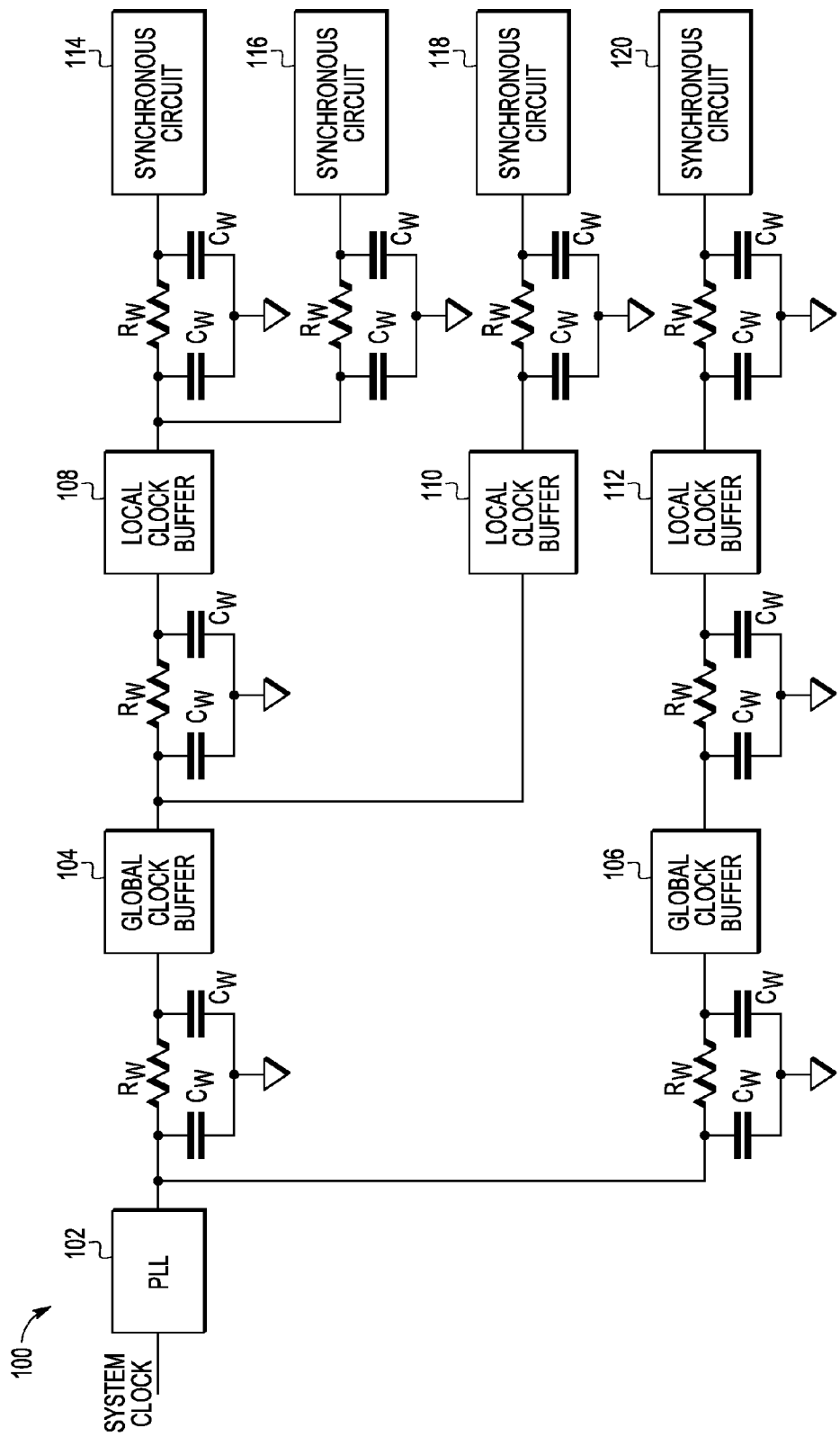
FIG. 1 illustrates a functional block diagram of an exemplary clock distribution network.

Referring to FIG. 1, in a typical integrated circuit, phase-locked loop 102, or other suitable clock generator provides an exemplary clock signal for coordinating actions of synchronous circuits of integrated circuit 100. Integrated circuit interconnects (e.g., conductive traces) fan out the clock signal for distribution using multiple paths. However, conductive traces have wire loading (e.g., wire loading represented by resistance $R_W$ and capacitance $C_W$) that results in attenuation of the clock signal. In addition, note that as dimensions of long global interconnect lines decrease with advances in integrated circuit manufacturing technology, the wire loading resistance of the conductive traces increases. Thus, global clock buffers 104 and 106 and local clock buffers 108, 110, and 112 are included to amplify the clock signal at intermediate locations along the distribution path after transmission over a length of interconnect. Those clock buffers provide sufficient drive for distribution of the clock signal using additional transmission lines or for driving a clock terminal of synchronous circuits 114, 116, 118, and 120.

Figure 2:
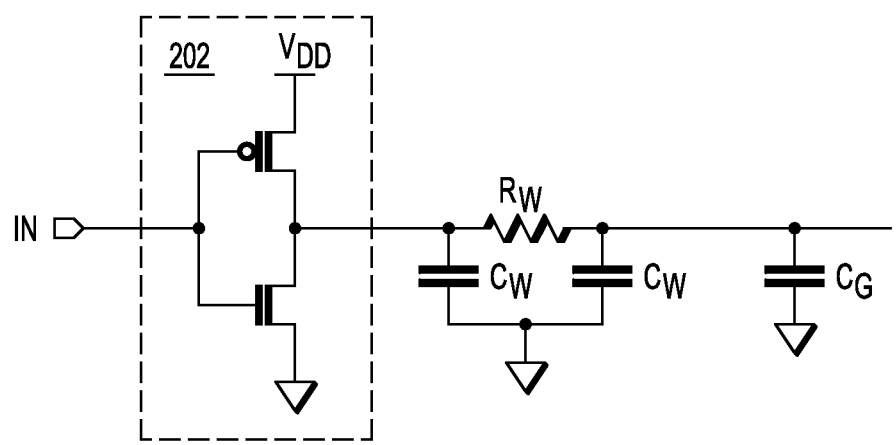
FIG. 2 illustrates a circuit diagram of an exemplary clock buffer that may be included in the clock distribution network of FIG. 1.

Typical global clock buffers 104 and 106 and local clock buffers 108, 110, and 112 are implemented using inverter driver circuits, e.g., inverter 202 of FIG. 2, to drive the conductive traces and a load (represented by load capacitance $C_G$), which may be another buffer or a synchronous circuit. Devices included in inverter 202 may be sized based on whether the inverter is included in a global clock buffer or a local clock buffer circuit and/or according to a load coupled to the particular buffer circuit (e.g., based on a length of conductive traces and/or loading of subsequent circuits, which may be additional buffer stages or destination synchronous circuits).

In a typical complementary metal oxide semiconductor (CMOS) integrated circuit, total power dissipation ($P_{total}$) is the sum of the static power dissipation ($P_s$), which is comprised mostly of transistor drain-to-source leakage, gate leakage, and any intentional DC currents consumed by the circuit, the dynamic power dissipation ($P_d$), and short circuit power dissipation ($P_{sc}$), which is based on current consumed during a transition between digital high and low states. That is, $$P_{total}=P_s+P_d+P_{sc},$$

where $P_s=\Sigma_1^n$ leakage current$\times V_{DD}$, and n is the number of devices, $P_d=C_L V_{DD}^2 f_p$, where $C_L$ is the total switched capacitance (e.g., gate capacitance plus metal wire capacitance) and $f_p$ is the nominal clock frequency of operation, and $P_{sc}=I_{cb}\times V_{DD}$, where $I_{cb}$ is the crowbar (i.e., short circuit) current consumed during a transition between digital high and low states of nodes.

A technique for reducing the total power dissipation of an integrated circuit reduces the voltage swing of the signal being distributed from a full-swing signal (e.g., a peak-to-peak voltage swing of $V_{DD}-V_{SS}$) to a low-voltage swing signal (e.g., a voltage swing of $V_{DD}-V_1-V_{SS}$). As referred to herein, a peak-to-peak low-voltage swing signal is a signal that has a voltage swing that is less than the voltage swing of a signal swinging rail-to-rail, e.g., a signal swinging from the voltage level on a first power supply node to a voltage on a ground or reference voltage node (e.g., $V_{DD}$ and $V_{SS}$) of the integrated circuit. That is, a low-voltage signal has a signal voltage swing that is less than $V_{DD}-V_{SS}$, the signal swing of a typical ground-referenced CMOS digital signal. The reduction in voltage swing reduces the dynamic power dissipation of the clock distribution network at the same leakage power dissipation as compared to the typical clock distribution network including buffers implemented with standard inverter circuits. The technique does not require any additional power supplies and maintains a size of the buffer to within approximately two-and-a-half times the size of a standard CMOS buffer. The technique may be seamlessly incorporated into a digital circuit design flow and associated views (i.e., logical, physical, and electrical views). For example, the technique may be easily incorporated into timing and power parameters associated with any cell in a library associated with the integrated circuit design. The technique is scalable and may be easily migrated into multiple integrated circuit manufacturing technologies.

In at least one embodiment, the technique for reducing power dissipation uses a single power supply (e.g., a single $V_{DD}$ and a ground reference node) and a low-swing clock distribution network including low-swing buffer circuits having $$\Sigma(C_L \times (V_{DD}-V_1-V_{SS})^2 \times f_p + C_{internal} \times V_{DD}^2 \times f_p) < \Sigma(C_L \times V_{DD}^2 \times f_p).$$

For example, $V_1$ is the threshold voltage of an n-type device, $V_{THN}$, and the voltage swings between $V_{SS}$ and $V_{DD}-V_{THN}$. In other embodiments, $V_1$ is the threshold voltage of a p-type device, $V_{THP}$, and the voltage swings between $V_{SS}+|V_{THP}|$ and $V_{DD}$. In yet other embodiments $V_1$ is $V_{THN}+|V_{THP}|$ and the voltage swings between $V_{SS}+|V_{THP}|$ and $V_{DD}-V_{THN}$.

Figure 3:
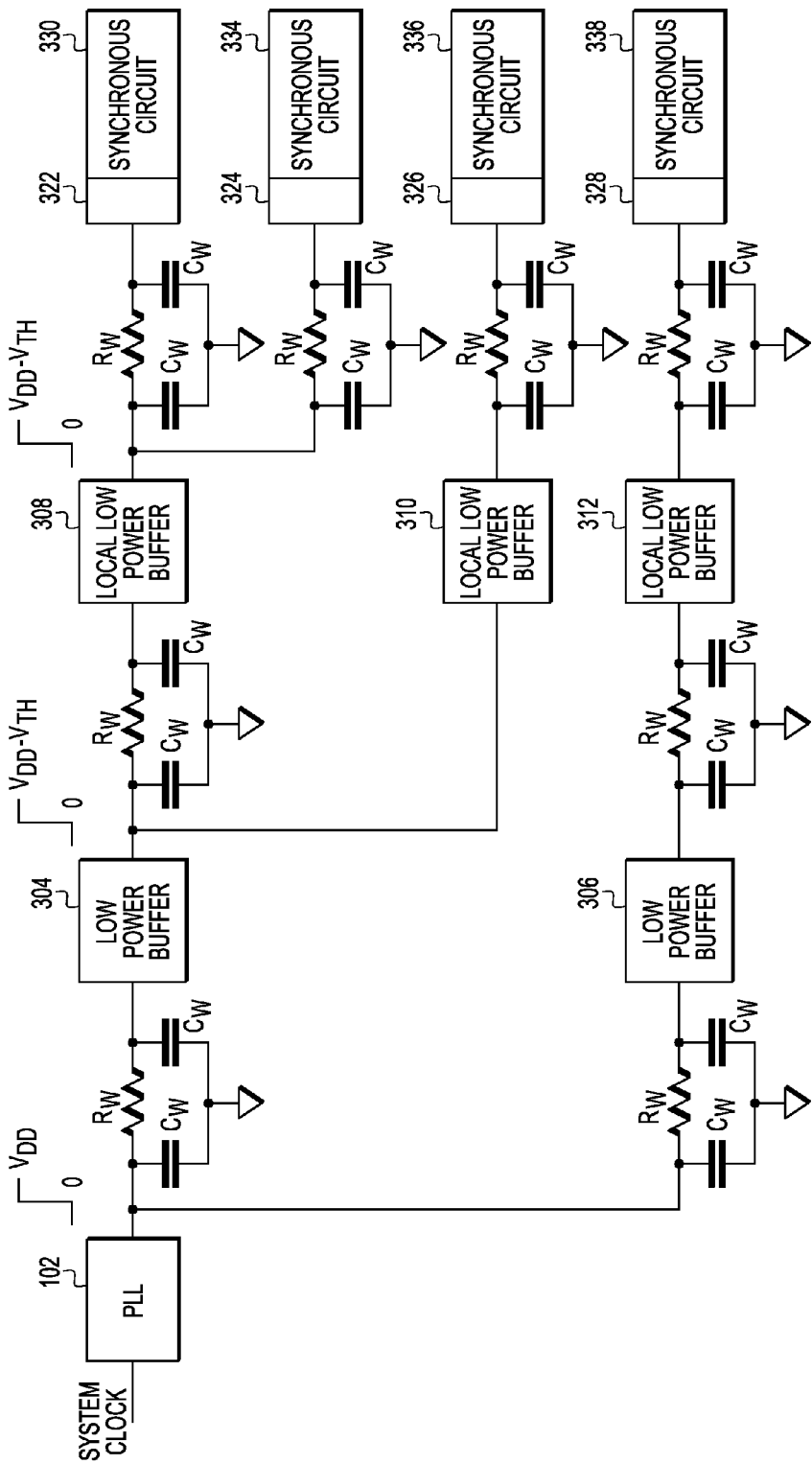
FIG. 3 illustrates a functional block diagram of an exemplary clock distribution network consistent with at least one embodiment of the invention.

Referring to FIGS. 1 and 3, to reduce the voltage swing of signals for distribution, the low-power clock distribution network uses low power buffers 304 and 306 and local, low-power buffers 308, 310, and 312 in place of the global clock buffers 104 and 106, and local clock buffers 108, 110, and 112, respectively. Low-power buffers 304 and 306 initially reduce a signal swing to a low-voltage signal swing, and low-power buffers 308, 310, and 312 maintain the low-voltage signal swing of the distributed signal. Low-power buffers 308, 310, and 312 may be implemented by embodiments of buffer 400 illustrated in FIG. 4, although individual devices in low-power buffers 304 and 306 may have sizes or strengths (e.g., transistor widths and/or lengths) different from sizes or strengths of corresponding devices included in low-power buffers 308, 310, and 312.

Figure 4:
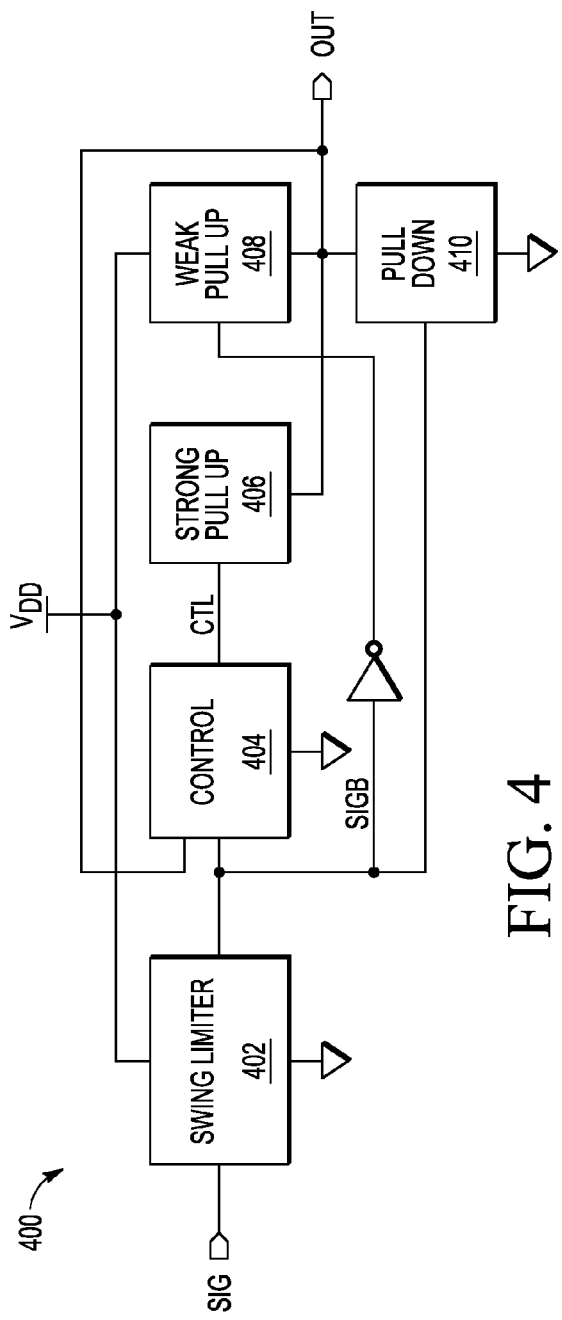
FIG. 4 illustrates a functional block diagram of an exemplary low-power clock buffer consistent with at least one embodiment of the invention.
Figure 5:
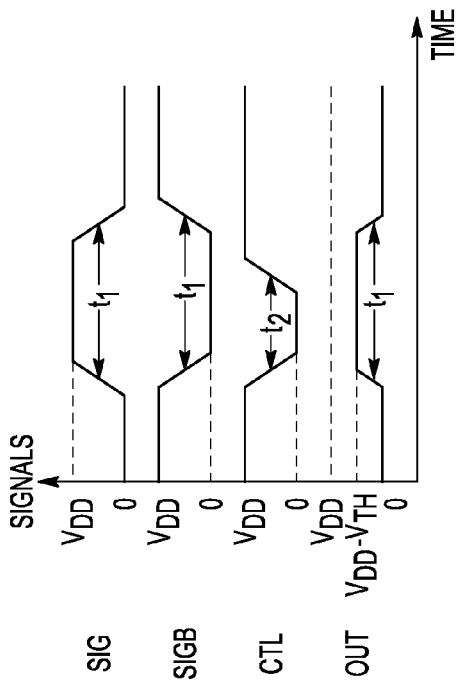
FIG. 5 illustrates an exemplary timing diagram for the low-power clock buffer of FIG. 4 consistent with at least one embodiment of the invention.

Referring to FIGS. 4 and 5, low-power buffer 400 reduces power consumption of an integrated circuit by reducing the voltage swing of a signal being driven for distribution. Embodiments of low-power buffer 400 may reduce dynamic power consumption by approximately 20% to 40% and may reduce static power consumption by at least 50% as compared to a buffer solution implemented using standard inverter circuits configured to drive a full-swing signal. Low-power buffer circuit 400 generates a low-voltage swing version of a received signal using a swing limiting input circuit. Low-buffer circuit 400 includes a control circuit configured to provide a control signal to a fast output circuit. A weak output circuit limits the voltage swing of the output signal. Low-power buffer 400 uses only one power supply (e.g., a single $V_{DD}$ and a ground reference node) and does not require any additional voltage references to be generated on-chip.

In at least one embodiment, buffer 400 receives a typical clock signal SIG that oscillates between a high state and a low state with a 50% duty cycle and a constant frequency. An active level of the clock signal is a high level that corresponds to a digital '1' value, e.g., $(V_{DD}-V_{SS})/2 < V < V_{DD}$, and an inactive level is a low level that corresponds to a digital '0' value, i.e., $V_{SS} < V < (V_{DD}-V_{SS})/2$. Low-power buffer 400 receives clock signal SIG and swing limiting circuit 402 adjusts the amplitude of the received signal and controls the leakage of the buffer to have a peak-to-peak voltage swing of $V_{DD}-V_{SS}$, regardless of the voltage swing of clock signal SIG, which may be greater than or less than the peak-to-peak voltage swing of $V_{DD}-V_{SS}$. Swing limiter circuit 402 provides signal SIGB having a voltage swing of $V_{DD}-V_{SS}$. Control circuit 404 then generates control signal CTL that is a full-swing control signal based on signal SIGB and output signal OUT of the buffer that is fed back to control circuit 404. Control signal CTL is a pulse that is used to enable a fast switching circuit, which in one embodiment of low power buffer 400 is strong pull-up circuit 406. Control signal CTL enables the fast switching circuit for duration $t_2$ that is less than duration $t_1$ of a high level of the clock signal SIG, and less than the duration of a high level of the output signal OUT. Control signal CTL enables the fast switching circuit to quickly charge the output node to a voltage level that is less than $V_{DD}$.

Control signal CTL disables strong pull-up circuit 406 prior to charging the output node to a voltage level of $V_{DD}$. Assuming that strong pull-up circuit 406 would charge the output node to $V_{DD}$ if control signal CTL has an active level for the entire duration of the clock signal SIG being active, control signal CTL has an active level for a duration that is less than the duration of clock signal SIG being active. Meanwhile, an inverted version of signal SIGB enables another switching circuit, e.g., weak pull-up circuit 408, for the entire duration of clock signal SIG being active. Weak pull-up circuit 408 reinforces charge on the output node for the entire duration of clock signal SIG being active to maintain the peak voltage level of the reduced swing signal (e.g., $V_{DD}-_{THN}$) for the duration of the active level of clock signal SIG. A low level of clock signal SIG disables weak-pull-up circuit 408 and enables pull-down circuit 410. Accordingly, pull-down circuit 410 discharges the output node to $V_{SS}$ to provide output signal OUT having an inactive level for the entire duration of clock signal SIG being inactive.

Figure 6:
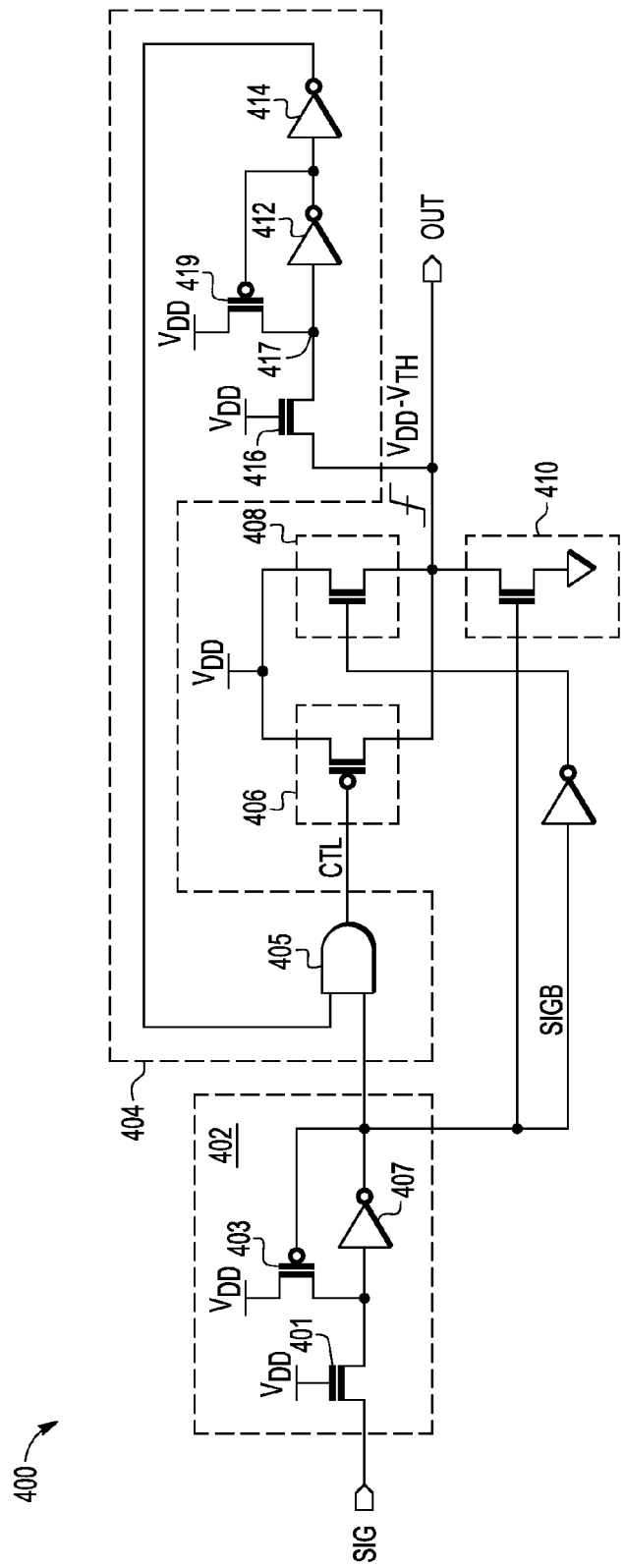
FIG. 6 illustrates a circuit diagram of the exemplary low-power clock buffer of FIG. 4 consistent with at least one embodiment of the invention.

Referring to FIG. 6, an exemplary circuit implementation of buffer 400 includes pass gate 401 and a cheater latch (i.e., keeper latch, e.g., the circuit including device 403 and inverter 407) in swing limiting circuit 402 that generates the swing-limited version of the received clock signal. In other embodiments of buffer 400, pass gate 401 may be included as part of a transmission gate. Device 403 and inverter 407 of the cheater latch are sized to be overridden by the output of pass gate 401 and are used to limit the voltage swing of clock signal SIG. In at least one embodiment, control circuit 404 includes pass gate 416 and a cheater latch circuit (e.g., the cheater latch formed by device 419 and inverter 412) that boosts the voltage swing of the output signal to back to a full swing. Control circuit 404 logically combines that full-swing version of the output signal (e.g., the output of inverter 414) with signal SIGB, which is a swing-limited version of clock signal SIG, to generate control signal CTL. Note that in other embodiments of control circuit 404, pass gate 416 is excluded. Once the voltage on node 417 reaches the threshold voltage of inverter 412, after the delay introduced by inverters 412 and 414, control signal CTL transitions high, thereby disabling strong pull-up circuit 406, which in one embodiment is a p-type circuit including one or more p-type devices. The width of the pulse of CTL may be varied by varying the time difference between the signals provided to AND gate 405. For example, in the exemplary buffer of FIG. 6, signal SIGB (i.e., the swing-limited version of the clock signal SIG) arrives at the input to AND gate 405 approximately three inverter delays prior to the output of inverter 414, thereby reducing the width of the pulse CTL by three inverter delays. However, in other embodiments of control circuit 404, different or additional delay elements (e.g., additional inverters and/or buffers) may be used. For example, inverter 414 may have a selectable delay and/or threshold voltage, or may be coupled to a feedback buffer having a programmable delay and/or threshold voltage. The selectable delay and/or threshold voltage may be used to adjust the edge rate of the output signal, OUT, and provide control over the level between $V_{DD}-_{TH}$ to $V_{DD}$ of the swing-limited voltage swing of OUT. Note that in other embodiments of control circuit 404, additional or alternate logic gates may be used to implement the logical function (e.g., the logical function of AND gate 405) used to generate CTL.

Figure 9:
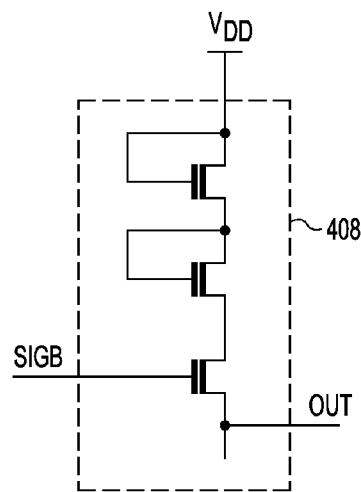
FIG. 9 illustrates a circuit diagram of an exemplary pull-down circuit consistent with at least one embodiment of the invention.

Although CTL shuts off strong pull-up circuit 406, weak pull-up circuit 408 remains enabled until after the input clock signal transitions low. After clock signal SIG transitions low, weak pull-up circuit 408 is disabled and the n-type circuit in pull-down circuit 410 is enabled and discharges the output node. In at least one embodiment, weak pull-up circuit 408 is an n-type circuit including one or more n-type devices that deliver charge to the output node at a peak voltage level of $V_{DD}-_{TH}$. In at least one embodiment, pull-down circuit 410 is an n-type circuit including one or more n-type devices coupled between the output node and $V_{SS}$ or ground. Note that in other embodiments having sufficient voltage headroom, weak pull-up circuit 408 includes n n-type devices cascaded in series between $V_{DD}$ and the output node (as illustrated in FIG. 9) and the peak voltage level of the low-swing signal is $V_{DD}-(n \times V_{THN})$. Note that after fast pull-up circuit 406 shuts off and while the received clock signal is high, weak pull-up 408 remains enabled and reinforces the voltage on the output node to $V_{DD}-(n \times V_{THN})$.

Figure 7:
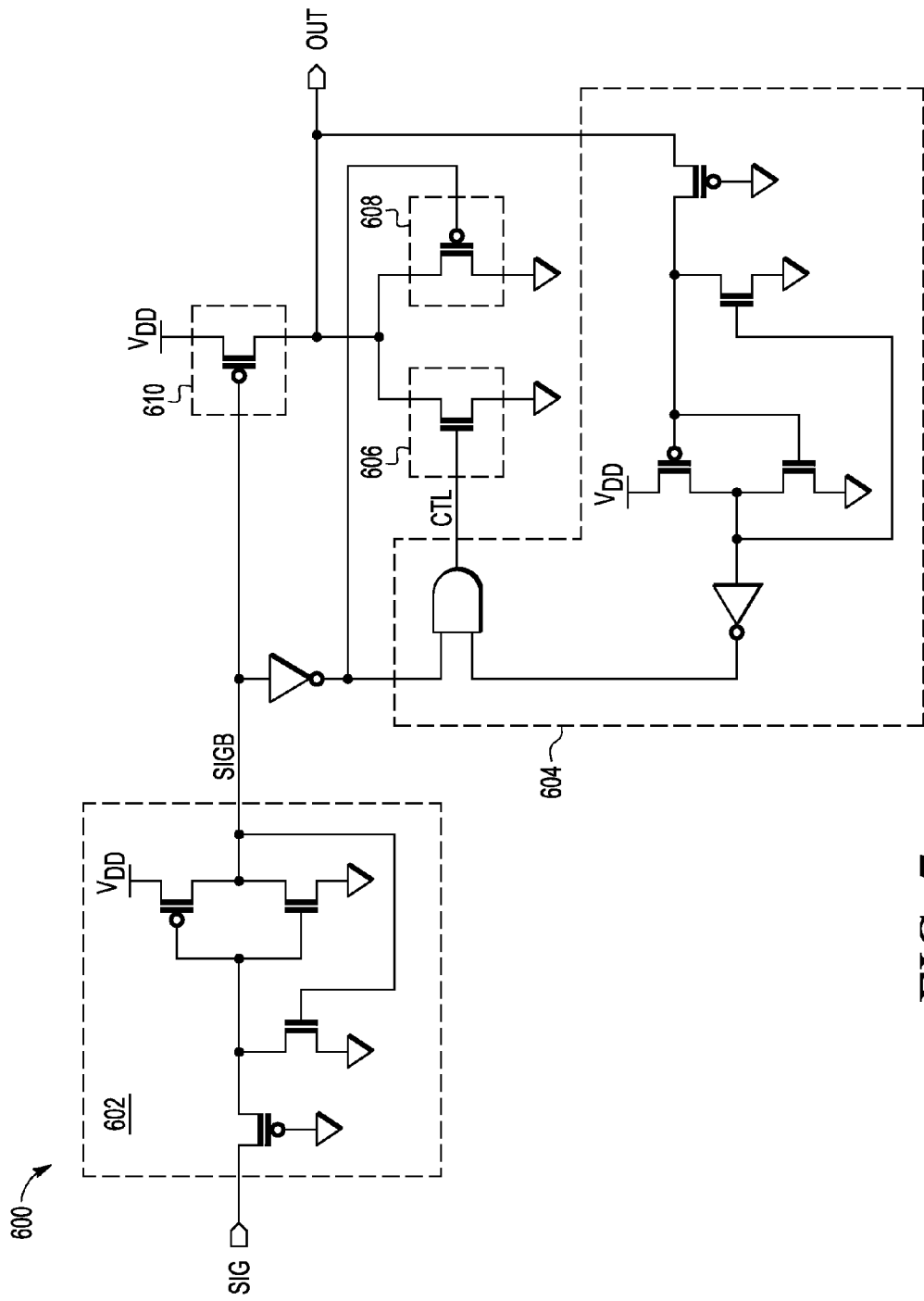
FIG. 7 illustrates a functional block diagram of an exemplary low-power clock buffer consistent with at least one embodiment of the invention.
Figure 8:
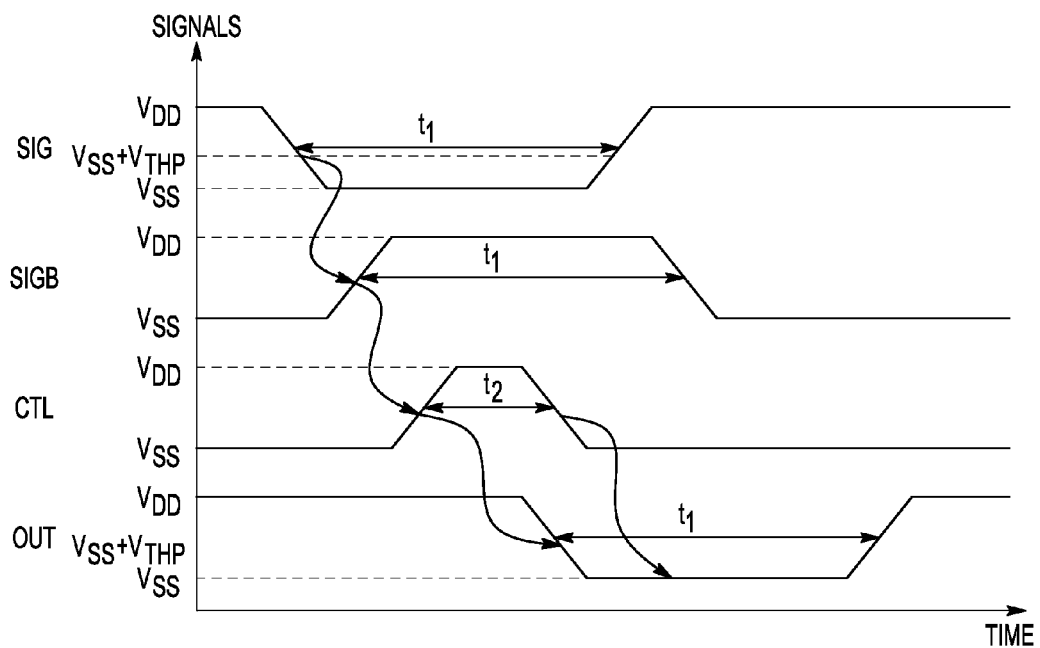
FIG. 8 illustrates an exemplary timing diagram for the low-power clock buffer of FIG. 7 consistent with at least one embodiment of the invention.

Referring to FIGS. 7 and 8, other embodiments of a low-power buffer consistent with techniques described herein use a circuit that is complementary to the circuit of FIGS. 4 and 5. That is, rather than using a strong pull-up circuit, a weak pull-up circuit, and a pull-down circuit, low-power buffer 600 of FIG. 7 uses strong pull-down circuit 606 (which may include an n-type circuit of one or more n-type pull-down devices coupled between the output node and $V_{SS}$), weak pull-down circuit 608 (which includes a p-type circuit of one or more p-type devices coupled between the output node and $V_{SS}$), and pull-up circuit 610 (which may include a p-type circuit of one or more p-type devices coupled between the output node and $V_{DD}$). Accordingly, the output voltage of output signal, OUT, generated by buffer 600 swings between $V_{SS}+|V_{THP}|$ and $V_{DD}$, as illustrated in FIG. 8, or between $V_{SS}+(n \times |V_{THP}|)$ and $V_{DD}$.

Referring back to FIG. 3, the low-power buffers described herein may drive interconnects coupled to additional low-power buffers (e.g., local low-power buffers 308, 310, and 312) or may drive interconnects coupled to synchronous circuits 330, 334, 336, and 338. The interconnects transport outputs of corresponding low-power buffers to respective synchronous circuits 330, 334, 336, and 338, which may include storage and/or processing circuits. The low power buffers each include swing-limiting circuit 402 of FIG. 6 that adjusts the voltage swing from the low-voltage swing signal to the regular voltage swing. A similar circuit is included in each of input stages 322, 324, 326, and 328 of synchronous circuits 330, 334, 336, and 338, respectively, of FIG. 3, to boost the low-voltage swing signal to a regular voltage swing for use as clock signals by the corresponding synchronous circuits. Referring back to FIG. 6, note that the output of inverter 414 is a full-swing version of the output signal, OUT, and may be used locally.

Thus various embodiments of low-power buffers used in techniques for reducing power consumption of an integrated circuit by reducing power consumption contributions of clock (or other high fan out signal) distribution have been disclosed. Note that the techniques described herein do not require on-chip voltage regulators or on-chip voltage references and/or additional separate power supplies that may increase the cost of the SoC.

An apparatus includes a first circuit of a first type configured to couple an output node to a first power supply node in response to a first value of a control signal. The apparatus includes a second circuit of a second type configured to couple the output node to the first power supply node in response to a first value of a first signal having a first voltage swing. The apparatus includes a third circuit of the second type configured to couple the output node to a second power supply node in response to a second value of the first signal. The apparatus includes a control circuit coupled to the first and second power supply nodes and configured to generate the control signal based on the first signal and an output signal on the output node. The first, second, and third circuits are configured to generate the output signal on the output node. The output signal has a second voltage swing less than the first voltage swing. The control signal may have a first active level duration less than a second active level duration of the first signal and less than a third active level duration of the output signal. The second voltage swing may be based on a selected value of the first active level duration of the control signal. The control circuit may include a cheater latch responsive to the output signal to generate a full-swing version of the output signal having the first voltage swing. The control circuit may include a logic circuit responsive to the first signal and the full-swing version of the output signal to generate the control signal. The apparatus may include an input circuit configured to limit a voltage swing of the first signal to the first voltage swing. The first signal may be generated based on a received signal and a first voltage on the first power supply node and a second voltage on the second power supply node. The first circuit may be disabled in response to the second value of the control signal. The second circuit may be disabled in response to a second value of the first signal. The third circuit may be disabled in response to the first value of the first signal. The first circuit may include a p-type device coupled between the first power supply node and the output node. The second circuit may include an n-type device coupled between the first power supply node and the output node. The third circuit may include an n-type device coupled between the output node and the second power supply node. The first power supply node may have a higher voltage than the second power supply node. The first voltage swing may be $V_{SS} < V < V_{DD}$ and the second voltage swing may be $V_{SS} < V < V_{DD} - V_{TH}$, where $V_{DD}$ is a voltage on the first power supply node, $V_{SS}$ is a voltage on the second power supply node, and $V_{TH}$ is a threshold voltage of an n-type device in the second circuit. The first, second, and third circuits and the control circuit may be included in a clock buffer circuit, and the apparatus may further include a second clock buffer circuit coupled to the output node. The second clock buffer circuit may be configured to increase the voltage swing of the output signal to generate a second signal. The second clock buffer may include additional first, second, and third circuits configured to generate on an additional output node an additional output signal having the second voltage swing. The apparatus may include an input circuit configured to increase the voltage swing of the output signal to generate a clock signal having the first voltage swing and a sequential logic circuit synchronized by the clock signal.

A method includes generating a control signal based on a signal and an output signal. The signal has a first voltage swing based on a first voltage level on a first power supply node and a second voltage level on a second power supply node. The control signal has an active time less than an active time of the signal and less than an active time of the output signal. The method includes generating the output signal based on the signal and the control signal. The output signal has a second voltage swing less than the first voltage swing. Generating the output signal includes establishing a third voltage level on an output node in response to a first value of the signal and a first value of the control signal. the method includes reinforcing the third voltage level on the output node in response to the first value of the signal and a second value of the control signal. The method includes establishing the second voltage level on the output node in response to a second value of the signal. Generating the control signal may include generating a full-swing version of the output signal having the first voltage swing based on the output signal. The control signal may be generated based on the signal and the full-swing version of the output signal. The method may include selecting a delay of the control signal, thereby adjusting an edge-rate of the output signal. The method may include generating the signal by limiting the voltage swing of a received signal, the signal being based on the received signal. Establishing the third voltage level may include coupling the output node to the first power supply node using a first device having a first type, coupling the output node to the first power supply node using a second device having the second type, and disabling the first device of the first type in response to an inactive time of the control signal to establish the third voltage level on the output node. Reinforcing the third voltage level may include maintaining the output node coupled to the first power supply node using the second device after disabling the first device having the first type. Establishing the second voltage level may include disabling the second device in response to the second value of the signal and coupling the output node to the second power supply node using a third device having the second type in response to the second value of the signal. The method may include transporting the output signal to a processing circuit, increasing the voltage swing of the output signal to generate a clock signal having the first voltage swing after the transporting, and clocking the processing circuit using the clock signal. The method may include transporting the output signal, increasing the voltage swing of the output signal to thereby generate another signal having the first voltage swing, after the transporting, and generating an additional output signal having the second voltage swing based on the signal. The additional output signal may be generated based on the first voltage level and the second voltage level.

Although the invention is described herein with reference to specific embodiments, various modifications and changes can be made without departing from the scope of the present invention as set forth in the claims below. For example, rather than using the low-power buffer and distribution network for a clock signal, the techniques described herein may be applied to other circuits (e.g., other buffers or drivers, flip-flops, latches) and distribution for other types of signals (e.g., logic signals). Although described with regard to embodiments in which the clock signal is a ground-referenced, active-high signal having a 50% duty cycle and transmitted using only one wire, note that in other embodiments of an integrated circuit, the received signal uses a different referencing scheme, an active level is a low level, i.e., circuits are active low, the duty cycle varies from 50%, and/or the received signal is transmitted using multiple wires (i.e., the signal is a multi-phase signal) and techniques described herein may be modified or applied to the embodiments for those types of signals. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An apparatus comprising:
   a first circuit of a first type configured to couple an output node to a first power supply node in response to a first value of a control signal;
   a second circuit of a second type configured to couple the output node to the first power supply node in response to a first value of a first signal having a first voltage swing;
   a third circuit of the second type configured to couple the output node to a second power supply node in response to a second value of the first signal; and
   a control circuit coupled to the first and second power supply nodes and configured to generate the control signal based on the first signal and an output signal on the output node, the first, second, and third circuits being configured to generate the output signal on the output node, the output signal having a second voltage swing less than the first voltage swing.

2. The apparatus, as recited in claim 1, wherein the control signal has a first active level duration less than a second active level duration of the first signal and less than a third active level duration of the output signal.

3. The apparatus, as recited in claim 2, wherein the second voltage swing is based on a selected value of the first active level duration of the control signal.

4. The apparatus, as recited in claim 1, wherein the control circuit comprises:
   a cheater latch responsive to the output signal to generate a full-swing version of the output signal having the first voltage swing; and
   a logic circuit responsive to the first signal and the full-swing version of the output signal to generate the control signal.

5. The apparatus, as recited in claim 1, further comprising:
   an input circuit configured to limit a voltage swing of the first signal to the first voltage swing, the first signal being generated based on a received signal and a first voltage on the first power supply node and a second voltage on the second power supply node.

6. The apparatus, as recited in claim 1, wherein the first circuit is disabled in response to a second value of the control signal, the second circuit is disabled in response to the second value of the first signal, and the third circuit is disabled in response to the first value of the first signal.

7. The apparatus, as recited in claim 1, wherein the first circuit comprises a p-type device coupled between the first power supply node and the output node, the second circuit comprises an n-type device coupled between the first power supply node and the output node, and the third circuit comprises an n-type device coupled between the output node and the second power supply node, the first power supply node having a higher voltage than the second power supply node.

8. The apparatus, as recited in claim 1, wherein the first voltage swing is $V_{SS} < V < V_{DD}$ and the second voltage swing is $V_{SS} < V < V_{DD} - V_{TH}$, where $V_{DD}$ is a voltage on the first power supply node, $V_{SS}$ is a voltage on the second power supply node, and $V_{TH}$ is a threshold voltage of an n-type device in the second circuit.

9. The apparatus, as recited in claim 1, wherein the first, second, and third circuits and the control circuit are included in a clock buffer circuit, and wherein the apparatus further comprises:
a second clock buffer circuit coupled to the output node, the second clock buffer circuit being configured to increase a voltage swing of the output signal to generate a second signal, the second clock buffer comprising additional first, second, and third circuits configured to generate on an additional output node an additional output signal having the second voltage swing.

10. The apparatus, as recited in claim 9, wherein the apparatus further comprises:
an input circuit configured to increase the voltage swing of the output signal to generate a clock signal having the first voltage swing; and
a sequential logic circuit synchronized by the clock signal.

11. A method comprising:
generating a control signal based on a signal and an output signal, the signal having a first voltage swing based on a first voltage level on a first power supply node and a second voltage level on a second power supply node, the control signal having an active time less than an active time of the signal and less than an active time of the output signal; and
generating the output signal based on the signal and the control signal, the output signal having a second voltage swing less than the first voltage swing;
wherein generating the output signal comprises:
establishing a third voltage level on an output node in response to a first value of the signal and a first value of the control signal;
reinforcing the third voltage level on the output node in response to the first value of the signal and a second value of the control signal; and
establishing the second voltage level on the output node in response to a second value of the signal.

12. The method, as recited in claim 11, wherein generating the control signal comprises:
generating a full-swing version of the output signal having the first voltage swing based on the output signal, the control signal being generated based on the signal and the full-swing version of the output signal.

13. The method, as recited in claim 12, further comprising:
selecting a delay of the control signal, thereby adjusting an edge-rate of the output signal.

14. The method, as recited in claim 11, further comprising:
generating the signal by limiting the voltage swing of a received signal, the signal being based on the received signal.

15. The method, as recited in claim 11, wherein establishing the third voltage level comprises:
coupling the output node to the first power supply node using a first device having a first type;
coupling the output node to the first power supply node using a second device having a second type; and
disabling the first device of the first type in response to an inactive time of the control signal to establish the third voltage level on the output node.

16. The method, as recited in claim 15, wherein reinforcing the third voltage level comprises:
maintaining the output node coupled to the first power supply node using the second device after disabling the first device having the first type.

17. The method, as recited in claim 15, wherein establishing the second voltage level comprises:
disabling the second device in response to the second value of the signal; and
coupling the output node to the second power supply node using a third device having the second type in response to the second value of the signal.

18. The method, as recited in claim 11, further comprising:
transporting the output signal to a processing circuit;
after the transporting, increasing a voltage swing of the output signal to generate a clock signal having the first voltage swing; and
clocking the processing circuit using the clock signal.

19. The method, as recited in claim 11, further comprising:
transporting the output signal;
after the transporting, increasing a voltage swing of the output signal to thereby generate another signal having the first voltage swing; and
generating an additional output signal having the second voltage swing based on the signal, the additional output signal being generated based on the first voltage level and the second voltage level.

20. An apparatus comprising:
means for generating a control signal based on a signal and an output signal, the control signal having an active level with a duration less than a second duration of an active level of the signal and less than a third duration of an active level of the output signal; and
means for generating the output signal based on the signal and the control signal, the output signal having a voltage swing less than a voltage swing of the signal,
wherein the means for generating the output signal comprises:
means for establishing a voltage level on an output node in response to a first value of the signal and a first value of the control signal;
means for reinforcing the voltage level on the output node in response to the first value of the signal and a second value of the control signal; and
means for establishing a second voltage level on the output node in response to a second value of the signal.

* * * * *